March 30, 1954 G. E. MORTON 2,673,933

RADIO CIRCUIT TUNING DEVICE

Filed May 31, 1951

2 Sheets-Sheet 1

INVENTOR.
GEORGE E. MORTON
BY Hudson, Boughton,
Williams, David & Hoffmann.
ATTORNEYS March 30, 1954 G. E. MORTON 2,673,933

RADIO CIRCUIT TUNING DEVICE

Filed May 31, 1951

2 Sheets-Sheet 2

INVENTOR.
GEORGE E. MORTON
BY Hudson, Boughton, Williams, David & Hoffmann.
ATTORNEYS Patented Mar. 30, 1954 2,673,933

UNITED STATES PATENT OFFICE 2,673,933

RADIO CIRCUIT TUNING DEVICE

George E. Morton, North Royalton, Ohio, assignor to Designers for Industry, Inc., Cleveland, Ohio, a corporation of Ohio Application May 31, 1951, Serial No. 229,068

7 Claims. (Cl. 250—40)

This invention relates to radio circuit tuning apparatus and, as one of its objects, aims to provide a novel tuning device by which relatively sharp tuning of an oscillating circuit, such as a so-called high Q-ratio tank circuit, over a wide range of signal frequencies can be readily and consistently obtained and which can, if desired, be made of such small size as to be well suited for use in radio apparatus or the like which is required to be very compact or of miniature size.

Another object is to provide a novel radio circuit tuning device which includes a variable inductance having characteristics of a coaxial line.

A further object is to provide a novel radio circuit tuning device comprising a variable inductance which also functions as a coaxial resonator or filter, and in which the coil means or helix of the variable inductance also forms the inner conductor of a folded coaxial line.

Still another object is to provide a novel radio circuit tuner of the character above-mentioned in which the variable inductance includes a core member movable into the magnetic field of the coil means forming the inner coaxial conductor, and novel actuating means for imparting such movement to the core member.

Yet another object is to provide a novel radio circuit tuner comprising a variable inductance having characteristics of a folded coaxial line, and also embodying means enabling said variable inductance to function as an impedance matching device or an inductive coupling device.

As an additional object this invention provides a novel radio circuit tuner which embodies both a variable capacitance device and a variable inductance device of the folded coaxial line type mentioned above, and in which a single actuating device of a novel form serves both the variable capacitance and the variable inductance.

It is likewise an object of this invention to provide a novel radio circuit tuner of the character just mentioned in which a movable core member of the variable inductance and a movable capacitance member of the variable capacitance are movable along a common axis, and in which cooperating slot and follower means of a common actuating device having relatively rotatable coaxially nested sleeves converts the relative rotary movement of the sleeves into axial movement for the core member and the movable capacitance member.

The invention can be further briefly summarized as consisting in certain novel combinations and arrangements of parts hereinafter described and particularly set out in the claims hereof.

In the accompanying sheets of drawings.

Figures 1, 2, 3, 4, 5:
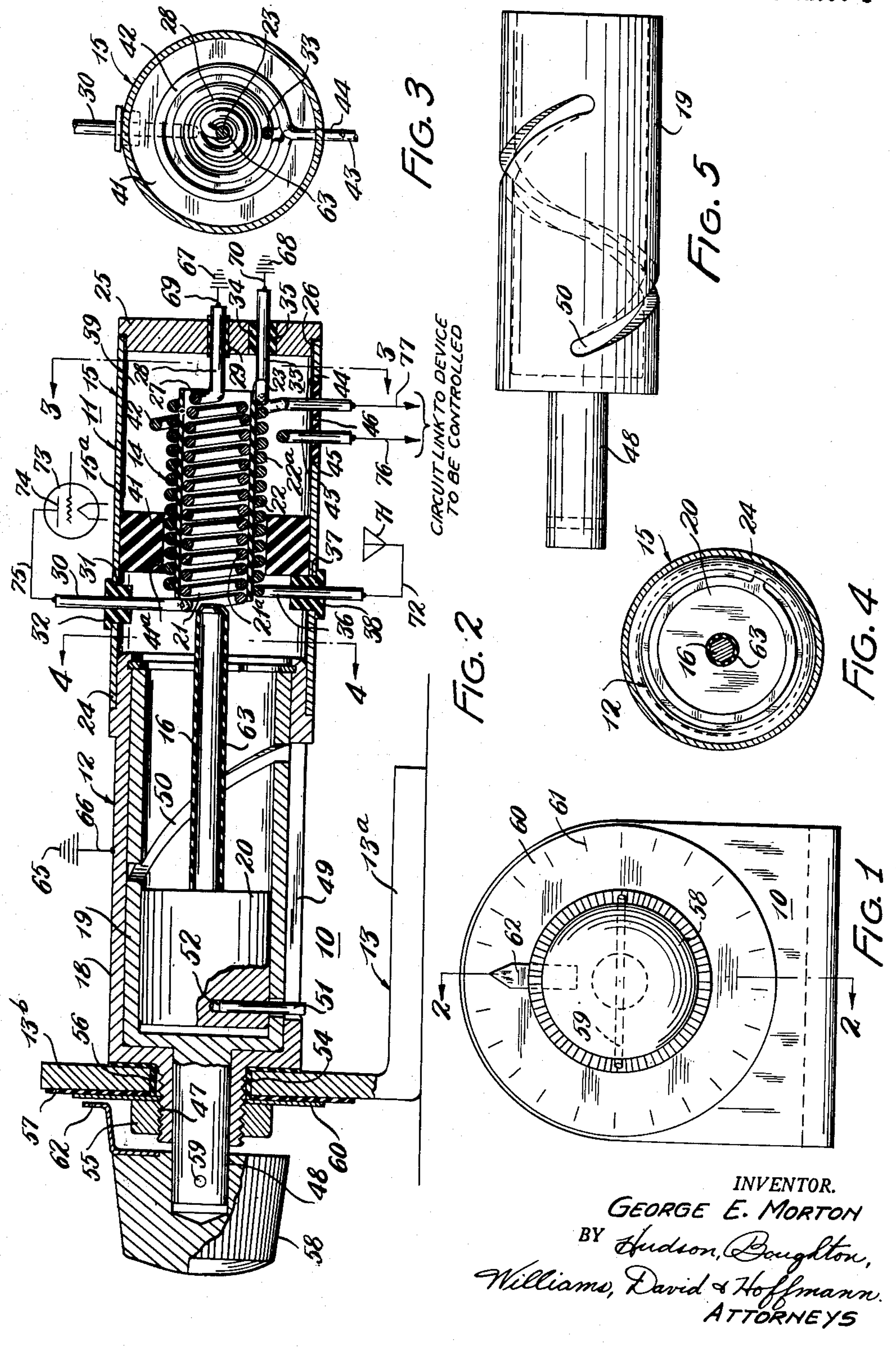
Fig. 1 is a front elevation of a radio circuit tuning device embodying the present invention.
Fig. 2 is a longitudinal vertical section taken through the device as indicated by section line 2—2 of Fig. 1.
Fig. 3 is a transverse section taken through the tuner on section line 3—3 of Fig. 2.
Fig. 4 is another transverse section taken on section line 4—4 of Fig. 2.
Fig. 5 is a side elevation showing the inner sleeve of the tuner actuating device in detached relation.

As one practical embodiment of this invention Figs. 1 to 5 inclusive show a radio circuit tuner 10 which comprises, in general, a variable inductance device 11 and an actuating device 12 for such variable inductance device. The circuit tuner 10 may also include a suitable support 13 which comprises a substantially horizontal wall portion 13ª and a substantially vertical wall portion 13ᵇ on which the variable inductance device 11 and the actuating device 12 are supported by connection of the latter with the vertical wall portion. The support 13 may, if desired, be a portion of the chassis of a radio apparatus or the like with which the circuit tuner 10 is used.

The variable inductance device 11 will be presently described in detail but, in general, comprises an inductance coil means 14, a surrounding metal shell 15 and a core member 16 which is movable into the magnetic field of the coil means.

The actuating device 12 will also be described in greater detail hereinafter but, in general, comprises a pair of coaxially nested outer and inner sleeves 18 and 19, and a carrier member or plunger 20 axially slidable in the inner sleeve 19.

The variable inductance device 11 will now be described in greater detail. The coil means 14 of this device is here shown as comprising a pair of coaxially disposed inner and outer coils or helices 21 and 22 and an insulating sleeve 23. The inner helix 21 is disposed inside the insulating sleeve 23 and the outer helix 22 is disposed in surrounding relation to the insulating sleeve. The helices 21 and 22 each comprise a longitudinally aligned row of relatively closely spaced serially connected single-turn convolutions. For the inner coil 21 these convolutions are designated $21^a$ and for the outer coil these convolutions are designated $22^a$.

The metal shell 15 comprises a substantially cylindrical metal sleeve $15^a$ which is open at its forward or outer end 24, and a transverse metal end wall or cap 25 to which the inner end of the sleeve $15^a$ is metallically connected as by means of solder 26.

The inner helix 21 of the coil means 14 is provided at one end thereof with a convergently tapered portion 27 terminating in an axially extending stem or terminal portion 28 which is electrically connected with the end wall 25 of the shell 15 as by extending into an opening of such end wall and retained therein by solder 29. At its opposite end, the inner helix 21 is provided with a substantially radially extending terminal portion 30 which projects through an opening 31 of the sleeve $15^a$ so as to be available for connection of a radio circuit therewith. The terminal portion 30 is insulated from the metal sleeve $15^a$ by a suitable insulator 32 through which this terminal portion extends.

The outer helix 22 is provided at one end thereof with an axial stem or terminal portion 33 which extends through an opening 34 of the end wall 25 and is insulated from such end wall by an insulating sleeve or bushing 35 through which this terminal portion extends. At its opposite end, the outer helix 22 is provided with a substantially radially extended terminal portion 36 which projects through an opening 37 in the metal sleeve $15^a$ and is insulated from the sleeve by a suitable insulator 38 through which this terminal portion extends.

The inductance coil means 14 extends longitudinally in the chamber 39 of the metal shell 15 in substantially coaxially spaced relation to the sleeve $15^a$. In this relation the coil means 14 corresponds with the inner conductor of a coaxial line, and by reason of the fact that this coil means is formed by coil components in the form of the helices 21 and 22, it corresponds with the inner conductor of a folded coaxial line.

The coil means 14 is supported in this coaxial relation in the shell 15 by the supporting engagement of the axial stem portions 28 and 33 with the end wall 25 and also by an insulating member 41 which is mounted in the sleeve $15^a$ adjacent the open end 24 thereof. The insulator 41 is here shown as comprising a disc or ring having a central opening $41^a$ through which the forward end of the coil means 14 extends.

The variable inductance device 11 preferably, though not necessarily, also includes a signal lead wire which defines a loop 42 extending in adjacently spaced inductively coupled relation around the coil means 14. This signal lead wire also includes terminal portions 43 and 44 which extend outwardly through an opening 45 of the sleeve $15^a$ of the metal shell and are isolated from the metal shell by an insulator 46 which is mounted in the opening 45 and through which these terminal portions extend.

The variable inductance device 11 is disposed in substantially coaxially aligned relation with the actuating device 12 and, as here shown, can be mounted on the actuating device by having the open outer end 24 of the metal shell 15 connected with the inner end of the actuating device. In this instance the open end 24 of the metal shell is telescoped over the inner end of the outer sleeve 18 of the actuating device and is connected therewith as by soldering or the like, or by a press fit. When the variable inductance device 11 is mounted in this relation, the hollow coil means 14 thereof will be disposed in coaxial alignment with the actuating device 12 for movement of the core member 16 by the latter into the hollow coil means, as will be further described hereinafter.

In the actuating device 12, the outer sleeve 18 is a stationary mounting sleeve having a forwardly projecting threaded hollow stem portion 47. The inner sleeve 19 is a driving sleeve which is rotatable in the outer sleeve and has a forwardly projecting axial shaft portion 48 which extends through the hollow stem portion 47. The outer sleeve is provided with an axially extending slot 49 formed in the wall thereof, and the inner sleeve 19 is provided with a helical slot 50 formed in the wall thereof and which extends in crossing relation to the axial slot 49.

The plunger 20 of the actuating device 12 is provided with a follower means which cooperates with the axial and helical slots 49 and 50 to render this plunger axially movable in response to rotary movement of the inner sleeve. This follower means is here shown as comprising a pin 51 which extends through these slots at their point of crossing relation and is connected with the plunger as by being engaged in a substantially radial opening 52 thereof. The core member 16 of the variable inductance device 11 is mounted on the plunger 20 so as to constitute an axial projection thereof, as by having its outer end suitably connected with the plunger.

When the inner sleeve 19 is rotated in one direction, the helical slot 50 wedgingly acts on the follower pin 51 and propels the plunger 20 axially in a direction to move the core member 16 into the hollow coil means 14. Rotation of the inner sleeve 19 in the reverse direction will propel the plunger 20 in the opposite direction to retract the core member 16 from the hollow coil means 14 to thereby move the core member into the nested sleeves of the actuating device 12 in which position the nested sleeves form a substantially complete shield for the core member. The engagement of the follower pin 51 in the axial slot 49 of the outer sleeve 18 holds the plunger 20 against rotation in the inner sleeve 19 during the above-explained wedging action exerted on the pin by the helical slot 50.

The slots 49 and 50 are of an appropriate length to provide for axial movement of the core member 16 for the desired distances into and out of the coil means 14. The helical slot 50 is here shown as extending for an arcuate distance of 360°, although if desired, this slot can be of greater or less arcuate extent than the 360° here shown. It will also be understood that the slope angle of the helical slot 50 can have any appropriate value depending upon the velocity desired to be imparted to the plunger 20 and the core member 16 during the axial movement thereof.

As shown in Fig. 2, the threaded hollow stem portion 47 of the outer sleeve 18 extends through an opening 54 of the vertical wall portion $13^b$ of the support 13 and is connected with this vertical wall portion as by means of the clamping nut 55. The actuating device 12 is electrically isolated from the vertical wall portion $13^b$ as by means of an insulating bushing 56 and an insulating washer 57.

Rotary movement can be imparted to the inner sleeve 19 by any suitable actuating means, such as the manually operable knob 58 here shown, and which is connected with the shaft portion 48 of the inner sleeve by the transverse pin 59.

Visual indicating means is provided to show the setting of the variable inductance device 11 and may comprise a dial 60 which is secured to the vertical wall portion $13^b$ by the clamping nut 55 and carries an arcuate scale of graduations 61 disposed around the axis of the shaft portion 48. This visual indicating means also includes a pointer 62 which is connected with the actuating knob 58 and is movable thereby in adjacent relation to the scale 61.

With respect to the construction materials used in the radio tuning device 10, it should be explained that the metal shell 15 and the helices 21 and 22 of the variable inductance device 11 should be made of a material having good electrical conductivity, preferably a non-ferrous metal such as copper or aluminum. The sleeves 18 and 19 and the plunger 20 of the actuating device 12 are preferably also made of a non-ferrous metal such as copper or aluminum. The insulators 23, 32, 35, 38, 41 and 46 can be made of any suitable insulating or dielectric material such as polystyrene or any other suitable plastic. In addition to being an insulator the sleeve 35 forms the dielectric element of a condenser of small capacity. The capacitance members of this condenser are formed by the cover 25 and the terminal portion 33 of the outer helix 22.

The core member 16 can be made from either a non-ferrous metal such as copper or aluminum or from a ferrous metal such as iron, but is preferably made of a composition comprising finely divided iron, such as carbonyl iron, and a binder such as a polyvinyl resin or other suitable plastic. When the core member 16 is made from such a composition of carbonyl iron and a binder, it can be readily molded to the desired shape and during use thereof the finely divided iron produces the desired effect of a laminated core member.

The core member 16 is preferably provided with an insulating covering 63 to isolate the same from direct electrical contact with the inner helix 21 when the core member is moved into the latter. The covering 63 can be of any suitable insulating or dielectric material, such as polystyrene or other suitable plastic, and can be molded in place on the core member in surrounding relation thereto.

The above-described variable inductance device 11 can be used in various kinds of radio apparatus and in various different radio circuits. This variable inductance device can be used as a variably tuned resonator or filter and when so used, the circuit in which it is employed will be highly discriminatory as to signal frequency tuning characteristics, and will have a high degree of frequency stability such that the tuned condition of the circuit will not be likely to drift from the desired frequency because of variations which may occur, such as variations in temperature or voltage.

The variable inductance device 11 can also be used as an impedance matching device or as a coupling device for obtaining inductive coupling between various circuits or circuit portions.

In connection with the uses and characteristics of the variable inductance device 11, it should also be explained that because of the closely spaced relation of the adjacent convolutions of the helices 21 and 22, the coil means 14 will provide, in effect, a current sheet which will approximate the current sheet of the solid straight center conductor of a conventional coaxial line having similar electrical values and properties. This closely spaced relation for the convolutions of the helices, also provides the same with a large distributed capacity. The chamber 39 of the metal shell 15 forms a resonating cavity for the coil means 14 and the metal shell also provides a substantially complete shield for the coil means.

The diameter and length of the shell 15 in relation to the diameter and length of the helices 21 and 22 can be so selected as to provide in the variable inductance device 11, substantially the characteristic impedance of a conventional solid-center-conductor coaxial line having similar electrical values and properties, but the overall length of the variable inductance device 11 will be a small value as compared with the length of such a conventional coaxial line. Although the variable inductance device 11 has been described above as embodying a coil means formed by the inner and outer helices 21 and 22, it should be understood that this coil means can, if desired, comprise a single coil or helix as shown in Fig. 6, or may comprise an auto transformer having coil sections inductively coupled by mutual inductance.

By way of example, Fig. 2 of the drawings also shows certain conventional radio circuit connections or components applied to the variable tuning device 10 and illustrate one way in which this device can be used in radio apparatus. These circuit connections or components comprise a ground 65 with which the outer sleeve 18 of the actuating device 12 is connected as by a conductor 66. These circuit connections or components also include grounds 67 and 68 with which the terminal portions 28 and 33 of the inner and outer helices 21 and 22 are connected as by means of the conductors 69 and 70. Fig. 2 also shows these radio circuit connections or components each including an antenna 71 which is connected with the terminal portion 36 of the outer helix 22 by a conductor 72, and an electron tube 73 having the plate 74 thereof connected with the terminal portion 30 of the inner helix 21 by the conductor 75. Conductors 76 and 77 are connected with the terminal portions 43 and 44 of the coupling loop 42 and represent a circuit link extending to some radio controlled device with which the tuner 10 is being used.

Figures 6, 7:
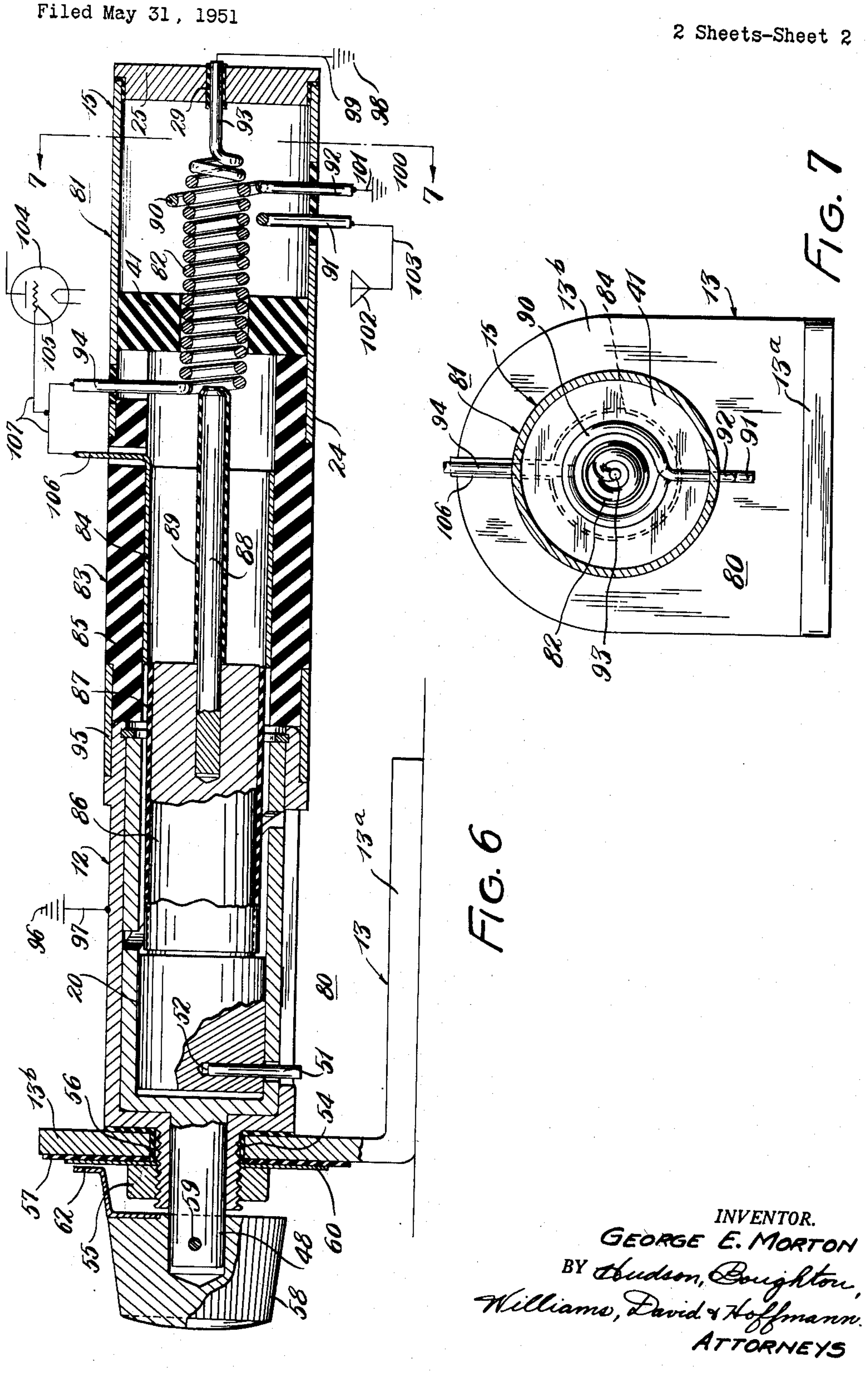
Fig. 6 is a longitudinal vertical section similar to Fig. 2 but showing a modified form of radio circuit tuning device.
Fig. 7 is a transverse vertical section taken through the modified tuner as indicated by section line 7—7 of Fig. 6.

Figs. 6 and 7 of the drawings show a radio circuit tuning device 80 which is similar to the radio circuit tuner 10 but represents a modified construction. The modified tuner 80 is similar to the above-described tuner 10 in that it includes an actuating device 12 which is substantially identical with the actuating device already described and with respect to which the same reference characters have been used to designate the same corresponding parts. The modified tuner 80 also includes a variable inductance device 81 which is similar to the variable inductance device 11 but differs therefrom in that the coil means 82 thereof is in the form of a single coaxial helix.

The modified circuit tuner 80 differs further from the above-described tuner 10 in that it includes a variable capacitance device 83 located between, and in coaxial relation to, the actuating device 12 and the variable inductance device 81. This variable capacitance device 83 comprises a tubular outer capacitance member 84 mounted in and supported by an insulating sleeve or barrel 85, and a substantially cylindrical inner capacitance member 86 in the form of solid axial extension of the plunger 20 of the actuating device 12. The inner capacitance member 86 is preferably provided with an insulating covering 87 comprising a surrounding sleeve formed of polystyrene or other suitable material and which can be molded in place thereon.

The variable inductance device 81 includes a core member 88 in the form of a stem, of a construction similar to the above-described core member 16, and carried by the plunger 20 of the actuating device 12. The core member 88 is mounted on the inner end of the inner capacitance member 86 and is connected with the plunger 20 by the latter. The core member 88 is provided with an insulating covering 89 similar to the above-described insulating covering 63.

The variable inductance device 81, preferably though not necessarily, includes a signal conducting loop 90 which is similar to the signal conducting loop 42 above-described and has terminal portions 91 and 92. The two ends of the helix 82 are provided respectively with terminal portions 93 and 94 of which the terminal portion 93 is electrically connected with the transverse end wall 25 as by the solder 29.

The insulating sleeve 85 of the variable capacitance device 83 forms a supporting connection by which the variable inductance device 81 can be mounted on the inner end of the actuating device 12. For this purpose the outer end of the insulating sleeve 85 is connected with the inner end of the actuating device as by means of a connecting ferrule 95. The outer end of the variable inductance device 81 is connected with the inner end of the insulating sleeve 85 as by having the end 24 of the metal shell 15 telescope such inner end of the insulating sleeve with a press fit.

With the construction thus far described for the variable tuner 80, it will be seen that the actuating device 12 serves both the variable inductance device 81 and the variable capacitance device 83 such that travel of the plunger 20 in one direction will move the core member 88 into the hollow coil means 82 and will also move the inner capacitance member 86 into the outer capacitance member 84. Travel of the plunger 20 in the opposite direction will retract the core member 88 from the hollow coil means 82 and will also retract the inner capacitance member 86 from the outer capacitance member 84.

With respect to the construction materials used in the variable tuning device 80, it should be explained that for the actuating device 12 and the variable inductance device 81, the materials can be the same as has already been mentioned for the same corresponding parts of the variable tuner 10. With respect to the variable capacitance device 83 and the outer and inner capacitance members 84 and 86 thereof, the materials used for these members are a metal of good electrical conductivity and preferably a non-ferrous metal such as copper or aluminum. The outer and inner capacitance members 84 and 86 can, if desired, be provided with a thin surface plating (not shown) of silver. The insulating sleeve 85 can be made of polystyrene or any other suitable dielectric material.

The tuning device 80 can be used in various kinds of radio apparatus and in various different radio circuits. As one example of such use, Fig. 6 shows certain conventional radio circuit connections or components applied to the variable tuner 80. These circuit connections and components include a ground 96 with which the actuating device 12 is connected as by means of the conductor 97, and a ground 98 with which the metal shell 15 as well as the terminal portion 93 of the coil means 82 are connected as by the conductor 99. These circuit connections also include a ground 100 with which the terminal portion 92 of the coupling loop 90 is connected as by the conductor 101. The radio circuit components here shown also include an antenna 102 with which the terminal portion 91 of the coupling loop 90 is connected by the conductor 103. Another of these circuit components is here represented by an electron tube 104 having a grid 105 with which the terminal portion 94 of the coil means 82 and the terminal portion 106 of the variable capacitance device 83 are connected by conductor means 107.

From the accompanying drawings and the foregoing detailed description, it will be now readily understood that this invention provides novel forms of radio circuit tuning devices which embody a variable inductance having characteristics of a folded coaxial line. It will also been seen that this invention provides a novel actuating device for a variable inductance, in which rotary actuating movement is converted into axial movement for a core member of the variable inductance. Additionally, it will be seen that a novel radio circuit tuner as contemplated by this invention may also embody a variable capacitance device which is served by the same actuating device as that which serves the variable inductance. Further, it will be seen that with the actuating means herein provided for this novel circuit tuner, the rotary actuating movement can extend through a full 360°, or through a greater arcuate distance, with the result that a visual indicating means can be used having widely spaced graduations for quick and easy reading of the settings to which the tuner is adjusted.

Although the novel radio circuit tuning devices of this invention have been illustrated and described herein to a somewhat detailed extent, it will be understood of course, that the invention is not to be regarded as being limited correspondingly in scope, but includes all changes and modifications coming within the terms of the claims hereof.

Having thus described my invention, I claim:

1. In a radio circuit tuning device of the character described, a tubular shell comprising a first metal sleeve open at one end and a transverse metal wall metallically connected with and substantially closing said first sleeve at its other end, inductance coil means comprising a wire helix extending longitudinally in said shell in substantially coaxially spaced relation to said first sleeve and having one end thereof electrically connected with said transverse wall, terminal means adapting the other end of said coil means for connection with a radio circuit, a pair of coaxially nested inner and outer sleeves located in substantially coaxially aligned relation to the open end of said first sleeve and one of said nested sleeves being rotatable relative to the other, a carrier member slidably supported by said nested sleeves for movement in an axial direction toward and away from the open end of said first sleeve, core means connected with said carrier member for movement thereby into the magnetic field of said coil means, said first sleeve having opening means in the wall thereof at a point intermediate the ends of said shell, a signal conducting member extending into said shell through said opening means and into spaced proximity to said coil means, and cooperating slot and follower means associated with said nested sleeves and carrier member and effective to convert the rotary movement of the rotatable sleeve into axial movement for said carrier member and core means.

2. In a radio circuit tuning device of the character described, a tubular shell comprising a first metal sleeve open at one end and a transverse metal wall metallically connected with and substantially closing said first sleeve at its other end, inductance coil means comprising a wire helix extending longitudinally in said shell in substantially coaxially spaced relation to said first sleeve and having one end thereof electrically connected with said transverse wall, terminal means adapting the other end of said coil means for connection with a radio circuit, a pair of coaxially nested inner and outer sleeves located in substantially coaxially aligned relation to the open end of said first sleeve and comprising a fixed sleeve and a driving sleeve rotatably supported by the fixed sleeve, a carrier member slidably supported by said nested sleeves for movement in an axial direction toward and away from the open end of said first sleeve, core means connected with said carrier member for movement thereby into the magnetic field of said coil means, said fixed sleeve having an axial slot in the wall thereof and said driving sleeve having a helical slot in the wall thereof extending in crossing relation to said axial slot, and follower means connected with said carrier member and engaging in both slots substanially at their point of crossing relation.

3. In a radio circuit tuning device of the character described, a tubular shell comprising a first metal sleeve open at one end and a transverse metal wall metallically connected with and substantially closing said first sleeve at its other end, inductance coil means comprising a wire helix extending longitudinally in said shell in substantially coaxially spaced relation to said first sleeve and having one end thereof electrically connected with said transverse wall, terminal means adapting the other end of said coil means for connecion with a radio circuit, a pair of coaxially nested inner and outer sleeves located in substantially coaxially aligned relation to the open end of said first sleeve and comprising a fixed sleeve and a driving sleeve rotatably supported by the fixed sleeve, a carrier member slidably supported by said nested sleeves for movement in an axial direction toward and away from the open end of said first sleeve, core means connected with said carrier member for movement thereby into the magnetic field of said coil means, said first sleeve having opening means in the wall thereof at a point intermediate the ends of said shell, a signal conducting member extending into said shell through said opening means and into spaced proximity to said coil means, said fixed sleeve having an axial slot in the wall thereof and said driving sleeve having a helical slot in the wall thereof extending in crossing relation to said axial slot, and follower means connected with said carrier member and engaging in both slots substantially at their point of crossing relation.

4. In a radio circuit tuning device of the character described, a tubular shell comprising a first metal sleeve open at one end and a transverse metal wall metallically connected with and substantially closing said first sleeve at its other end, hollow inductance coil means comprising a wire helix extending longitudinally in said shell in substantially coaxially spaced relation to said first sleeve and having one end thereof electrically connected with said transverse wall, terminal means adapting the other end of said helix for connection with a radio circuit, said helix being defined by a group of substantially axially aligned relatively closely spaced serially connected single-turn convolutions, a pair of coaxially nested sleeves located in substantially coaxially aligned relation to said first sleeve and adjacent the open end thereof and comprising a fixed outer sleeve and an inner driving sleeve rotatable in said outer sleeve, connecting means connecting the open end of said first sleeve with the inner end of said fixed outer sleeve so as to be supported thereby, a carrier member slidably supported by said nested sleeves for movement therein in an axial direction toward and away from the open end of said first sleeve, a core stem connected with said carrier member for endwise movement thereby into and out of said helix, said outer sleeve having an axial slot in the wall thereof and also having a hollow stem portion at its outer end, said inner sleeve having a helical slot in the wall thereof extending in crossing relation to said axial slot and also having a shaft portion projecting through said hollow stem portion, follower means connected with said carrier member and engaging in both slots substantially at their point of crossing relation, and actuating means connected with said shaft portion for imparting rotary movement to said inner sleeve.

5. A radio circuit tuning device as defined in claim 4, in which said hollow inductance coil means comprises a pair of coaxially disposed inner and outer wire helices each of which is defined by a group of substantially axially aligned relatively closely spaced serially connected single-turn convolutions.

6. In a radio circuit tuning device of the character described, a tubular shell comprising a first metal sleeve open at one end and a transverse metal wall metallically connected with and substantially closing said first sleeve at its other end, hollow inductance coil means comprising a wire helix extending longitudinally in said shell in substantially coaxially spaced relation to said first sleeve and having one end thereof electrically connected with said transverse wall, terminal means adapting the other end of said coil means for connection with a radio circuit, a pair of coaxially nested inner and outer sleeves located in substantially coaxially aligned relation to the open end of said first sleeve and comprising a fixed outer sleeve and an inner sleeve rotatable in said outer sleeve, a hollow tubular outer capacitance element disposed between said nested sleeves and the open end of said one sleeve and in substantially coaxially aligned relation therewith, a carrier member axially slidable in said nested sleeves for movement toward and away from said coil means, an inner capacitance element connected with said carrier member for endwise movement thereby into and out of said outer capacitance element, a core stem connected with said carrier member for endwise movement thereby into and out of said coil means, said outer sleeve having an axial slot in the wall thereof and said inner sleeve having a helical slot in the wall thereof extending in crossing relation to said axial slot, follower means connected with said carrier member and engaging in both slots at their point of crossing relation, and means adapted to impart rotary movement to said inner sleeve.

7. In a radio circuit tuning device of the character described, a tubular shell comprising a first metal sleeve open at one end and a transverse metal wall metallically connected with and substantially closing said first sleeve at its other end, hollow inductance coil means comprising a wire helix extending longitudinally in said shell in substantially coaxially spaced relation to said first sleeve and having one end thereof electrically connected with said transverse wall, terminal means adapting the other end of said coil means for connection with a radio circuit, a pair of coaxially nested inner and outer sleeves located in substantially coaxially aligned relation to the open end of said first sleeve and comprising a fixed outer sleeve and an inner sleeve rotatable in said outer sleeve, a hollow tubular outer capacitance element disposed between said nested sleeves and the open end of said one sleeve and in substantially aligned relation therewith, a carrier member axially slidable in said nested sleeves for movement toward and away from said coil means, an inner capacitance element connected with said carrier member for endwise movement thereby into and out of said outer capacitance element, a core stem connected with said carrier member for endwise movement thereby into and out of said coil means, said first sleeve having opening means in the wall thereof at a point intermediate the ends of said shell, a signal conducting member extending into said shell through said opening means and into spaced proximity to said coil means, said outer sleeve having an axial slot in the wall thereof and said inner sleeve having a helical slot in the wall thereof extending in crossing relation to said axial slot, follower means connected with said carrier member and engaging in both slots at their point of crossing relation, and means adapted to impart rotary movement to said inner sleeve.

GEORGE E. MORTON.

References Cited in the file of this patent

UNITED STATES PATENTS

| Number | Name | Date |
|---|---|---|
| 2,131,976 | Shaper | Oct. 4, 1938 |
| 2,210,303 | Polydoroff | Aug. 6, 1940 |
| 2,259,003 | Reid | Oct. 14, 1941 |
| 2,364,291 | Harvey | Dec. 5, 1944 |
| 2,394,391 | Martowicz | Feb. 5, 1946 |
| 2,398,112 | O'Brien | Apr. 9, 1946 |
| 2,497,662 | Dressel | Feb. 14, 1950 |
| 2,502,202 | Burroughes | Mar. 28, 1950 |
| 2,514,957 | Larson | July 11, 1950 |
| 2,516,056 | Keizer | July 18, 1950 |

FOREIGN PATENTS

| Number | Country | Date |
|---|---|---|
| 561,787 | Great Britain | June 5, 1944 |
| 780,003 | France | Apr. 17, 1937 |
| 821,535 | France | Dec. 7, 1937 |